(12) United States Patent
Moore

(10) Patent No.: US 7,295,060 B2
(45) Date of Patent: Nov. 13, 2007

(54) CHARACTERIZING AMPLITUDE AND PHASE TRANSFER RESPONSE OF AMPLIFIERS USING SINGLE PORT MEASUREMENTS

(75) Inventor: George Stennis Moore, Veradale, WA (US)

(73) Assignee: Agilent Technologies, Inc., Santa Clara, CA (US)

( * ) Notice: Subject to any disclaimer, the term of this patent is extended or adjusted under 35 U.S.C. 154(b) by 151 days.

(21) Appl. No.: 11/193,846

(22) Filed: Jul. 28, 2005

(65) Prior Publication Data
US 2007/0024353 A1    Feb. 1, 2007

(51) Int. Cl.
*G01R 19/00* (2006.01)
(52) U.S. Cl. .......................................................... 330/2
(58) Field of Classification Search ...................... 330/2; 455/115.1, 115.2, 115.3
See application file for complete search history.

(56) References Cited

U.S. PATENT DOCUMENTS 6,980,288 B2 *   12/2005   Kido et al. ................ 356/73.1

\* cited by examiner

*Primary Examiner*—Khanh Van Nguyen

(57) ABSTRACT

Single port characterization of RF amplifier phase and amplitude transfer functions are developed by measuring the output of the amplifier as it is excited by a predetermined frequency over a series of bias steps. One bias step is chosen as a reference level. Amplitude characterization is obtained from measured magnitude at each step in the test sequence. Phase information is extracted from the same measurements by measuring phase and phase trajectory at a reference level, and subtracting measured phase information at a desired step in the test sequence from an estimation of the reference phase trajectory at that step. Reference measurements may be interspersed with other measurements.

15 Claims, 3 Drawing Sheets

CHARACTERIZING AMPLITUDE AND PHASE TRANSFER RESPONSE OF AMPLIFIERS USING SINGLE PORT MEASUREMENTS

BACKGROUND OF THE INVENTION

1. Field of the Invention

The invention pertains to the art of characterizing the phase and amplitude transfer functions of radio frequency (RF) amplifiers.

2. Art Background

In an ideal radio frequency (RF) amplifier which has its gain set by an external bias level, the amplifier gain would be a linear, monotonic function of the bias level, and there would be no phase shift in the amplified signal over the range of bias and gain settings. Unfortunately, ideal amplifiers are hard to find. In many radio frequency (RF) applications, it is desirable or necessary to characterize the gain and phase transfer functions of RF amplifiers with respect to frequency and bias, often as a part of a manufacturing process or device test.

Traditionally, this analysis is performed using a two-port network analyzer. The network analyzer provides a reference input signal to the device under test (DUT) through a first port. The network analyzer, through a second port, captures the output of the DUT, and by comparing this captured output signal to the reference input signal, calculates the change in amplitude, or gain, of the amplifier, and the phase shift. This measurement process may be repeated over variations in parameters such as frequency, input amplitude, amplifier bias, and the like, to characterize the performance of the DUT.

In modern wireless devices, such as wireless communications devices, it may be difficult or impossible to make two port measurements of the output amplifier stage of the device. It may be difficult to perform a two port test measuring amplitude and phase response of the amplifier, for example during device test.

What is needed is a way to characterize amplitude and phase transfer functions of RF amplifiers using single port measurements.

SUMMARY OF THE INVENTION

Characterization of phase and amplitude transfer functions of an amplifier are obtained through single port measurements. The device containing the amplifier to be characterized excites the amplifier with a signal of known frequency and adjusts amplifier bias through a set of predetermined steps. The output of the amplifier is monitored by a measuring system. One of the bias steps is taken as a reference level. Coherent demodulation in the measuring system allows amplitude and phase information to be extracted for the amplifier under test. Phase, frequency, and amplitude information may be extracted by matching the received signal to a continuous-wave reference signal. Amplitude information is extracted by averaging the measured magnitude over each step in the test sequence and matching the estimate to the known bias step during that measurement interval. Phase information is extracted by processing the phase trajectory of the frequency offset corrected signal. Reference level conditions may be interspersed with bias steps.

BRIEF DESCRIPTION OF THE DRAWINGS

The present invention is described with respect to particular exemplary embodiments thereof and reference is made to the drawings in which.

DETAILED DESCRIPTION

Figure 1:
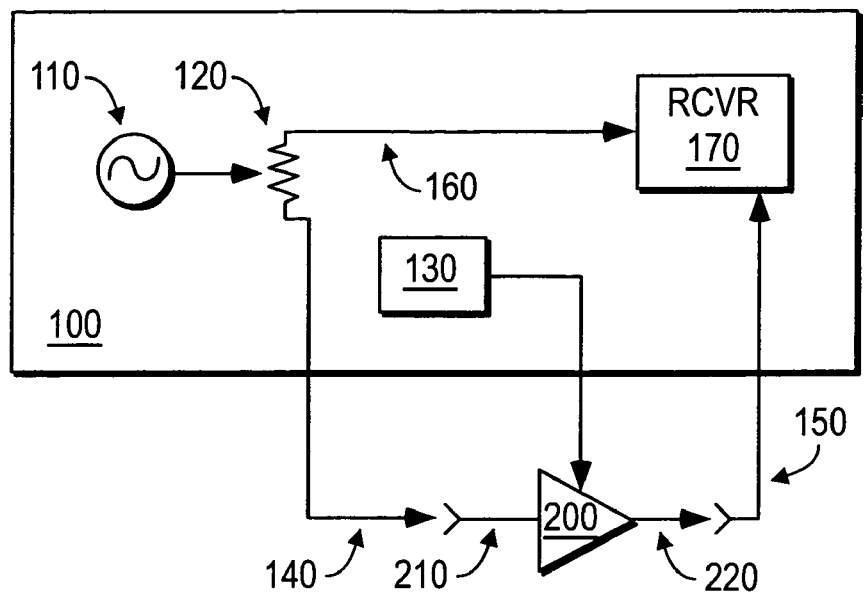
FIG. 1 is a block diagram of a network analyzer known to the art.

FIG. 1 shows a highly simplified block diagram of a prior art test setup using a network analyzer 100 to test a radio frequency (RF) amplifier 200, also referred to as the Device Under Test, or DUT. The primary characteristics of DUT 200 to be measured are amplitude and phase response at a particular frequency or group of frequencies, over a range of bias conditions.

Network analyzer 100 is a two port device. Network analyzer signal source 110 generates an RF signal of known amplitude and frequency. This signal is split 120. One signal path is supplied via port 140 to the input 210 of amplifier 200. Bias source 130 sets the gain of amplifier 220. The output 220 of amplifier 200 connects to port 150 of the network analyzer. This output signal, along with reference signal 160 from splitter 120 are processed by receiver 170. Comparing the amplitude of signal 150 with respect to reference signal 160 gives the gain of amplifier 200. Comparing the phase of signal 150 to the phase of reference signal 160 gives the phase shift of amplifier 200. These measurements are repeated at different settings of bias source 130. This is a simple two port measurement, measuring the change in amplitude and phase of the amplifier output with respect to the amplifier input. These measurements may also be repeated over different frequencies being generated by signal source 110.

In modern wireless devices, such as wireless communications devices, it may be difficult or impossible to make two port measurements of the output amplifier stage of the device. The amplifier in question is embedded inside a device where size and cost are at a premium; separate signal paths for use during testing are an expensive luxury. While it may be difficult to perform a two port test measuring amplitude and phase response of the amplifier, for example during device test, such information is needed to test and calibrate device operation.

Figure 2:
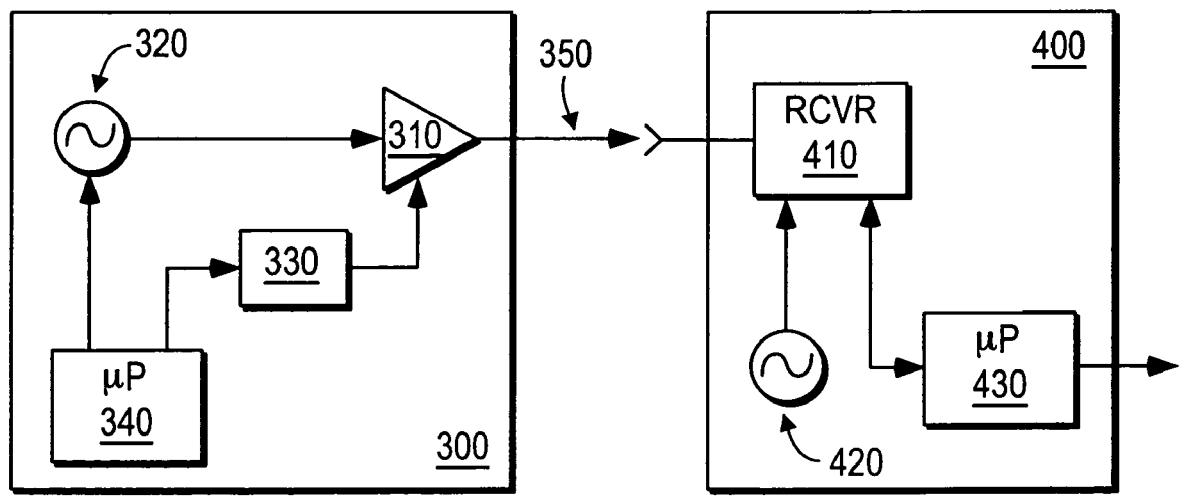
FIG. 2 is a block diagram of a test system.

According to the present invention, and as shown in the block diagram of FIG. 2, the internal architecture of device 300 may be used to permit single port measurements of amplifier amplitude and phase response.

As shown in FIG. 2 in simplified form, device 300 contains amplifier 310 which is driven by signal source 320, and bias source 330, producing output signal 350. The device, including signal source 320 and bias source 330 are controlled by processor 340. In a wireless device such as a wireless phone or wireless digital communications device, signal source 320 is typically a synthesized RF source. This signal is amplified by amplifier 310. The gain of amplifier 310 is controlled by bias source 330; most modern digital communications systems adjust the gain, and therefore the output power of the device so as to use the minimum power necessary to maintain a specified communications quality level.

Measurement unit 400 contains receiver 410 which uses reference source 420. Receiver 410 is controlled by software controlled processor 430.

Amplitude and phase measurements of amplifier 310 of FIG. 2 are made by placing device 300 in a test mode. This test mode may be initiated on device power-up, or via external signaling (not shown in FIG. 2) such as electrical contacts in a test assembly, or an external signal provided by measurement unit 400.

Once in the test mode, processor 340 commands source 320 to generate a predetermined frequency, and steps bias source 330 through a predetermined sequence of bias levels to amplifier 310. The frequency, steps, and the timing of these steps is known to measurement unit 400.

Figure 3:
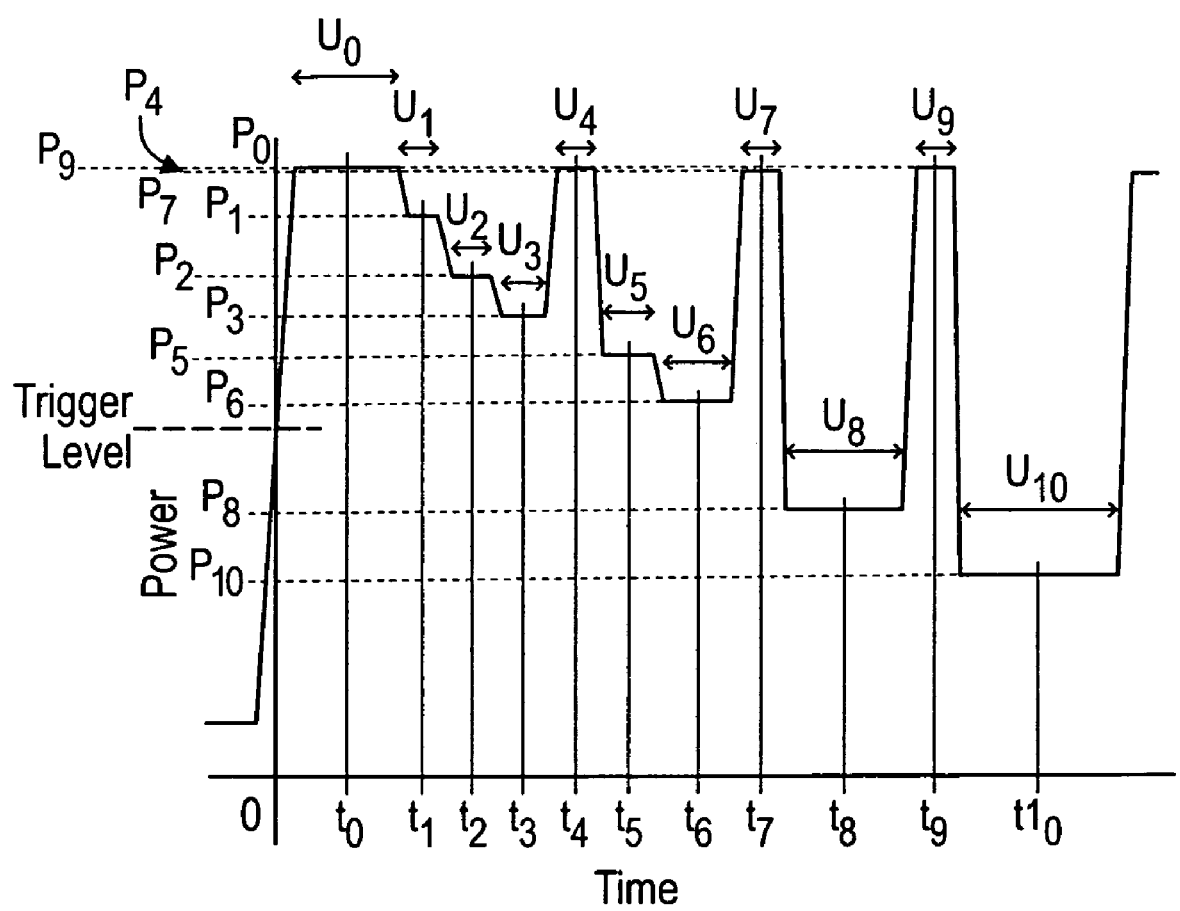
FIG. 3 is a graph of power vs time.

FIG. 3 shows a graph of the output power over time of signal 350 as measured by measurement unit 400. This graph shows power measurements $P_0$ through $P_{10}$ made at times $t_0$ through $t_{10}$ using measurement intervals $u_0$ through $u_{10}$. Techniques for measuring RF power are well known to the art. The measurement cycle begins when the power sensed by measurement unit 400 exceeds a preset trigger level. Since the timing of the test sequence to be executed by device 300 is known to measurement unit 400, this trigger event may be used to synchronize the measurement cycle between device 300 and measurement unit 400.

Device 300 generates a signal at a predetermined frequency and a predetermined bias level for its internal amplifier 310 for a predetermined time. Since the time of each interval $u_n$ is known, measurement unit 400 may make its power measurements centered around the middle of the interval. As an example, the first measurement, producing power level $P_0$ is made during interval $u_0$ and at time $t_0$. As is known to the measurement arts, a group of measurements may be taken in the interval and a representative value calculated from the ensemble.

Power output levels of amplifier 310 are correlated with bias levels.

As shown in FIG. 3, the power measurement $P_0$ at time $t_0$ is taken as a reference level. For successive measurements made at times $t_1$, $t_2$, and $t_3$, processor 340 in device 300 steps bias source 330 to produce lower power levels from amplifier 310. As an example, the reference level could be an expected power level of +24 dBm (corresponding to a power of 250 mW), with successive steps decreasing power by 3 dB per step. While the example of FIG. 3 shows the reference level as the first measurement, with successive measurements being at lower power levels, this is not required.

When two port amplifier measurements are made in the laboratory using laboratory equipment, such as shown in the block diagram of FIG. 1, it is relatively easy to vary some parameters, such as amplifier bias, while holding others constant. A laboratory-grade network analyzer, for example, contains a signal source 110 which is extremely precise and stable in terms of amplitude and frequency. A typical laboratory-grade network analyzer may also weigh in excess of fifty pounds.

Contrast this to the system shown in FIG. 2, where signal source 320 is part of device under test 300. It should not be surprising that a wireless device weighing a few ounces might not have the same stability characteristics as a piece of laboratory equipment.

Returning to the power vs. time graph of FIG. 3, while a series of measurements at successively lower power levels may be made in succession, it may be useful to return periodically to the initial reference conditions and re-establish the reference level. This is shown in FIG. 3 as the measurements made at times $t_4$, $t_9$, and $t_9$. As shown in FIG. 3, these measurements, made with nominally the same bias conditions to amplifier 310, produce slightly different corresponding power levels, $P_4$ at time $t_4$, $P_7$ at time $t_7$, and $P_9$ at time $t_9$. While the shift in reference power level may be slight, it may be important if tolerances are tight.

As shown in FIG. 3, the measurement intervals $u_0$ through $u_{10}$ are not the same. They may be made the same to simplify testing. In the embodiment shown, initial reference interval $u_0$ is longer to provide for synchronization between device 300 and measurement unit 400. At lower power levels, such as those shown as $P_6$, $P_8$, and $P_{10}$, the corresponding measurement intervals are increased so that more individual measurements are available to calculate the power level during that interval, reducing the effects of noise in measurement unit 400.

Figure 4:
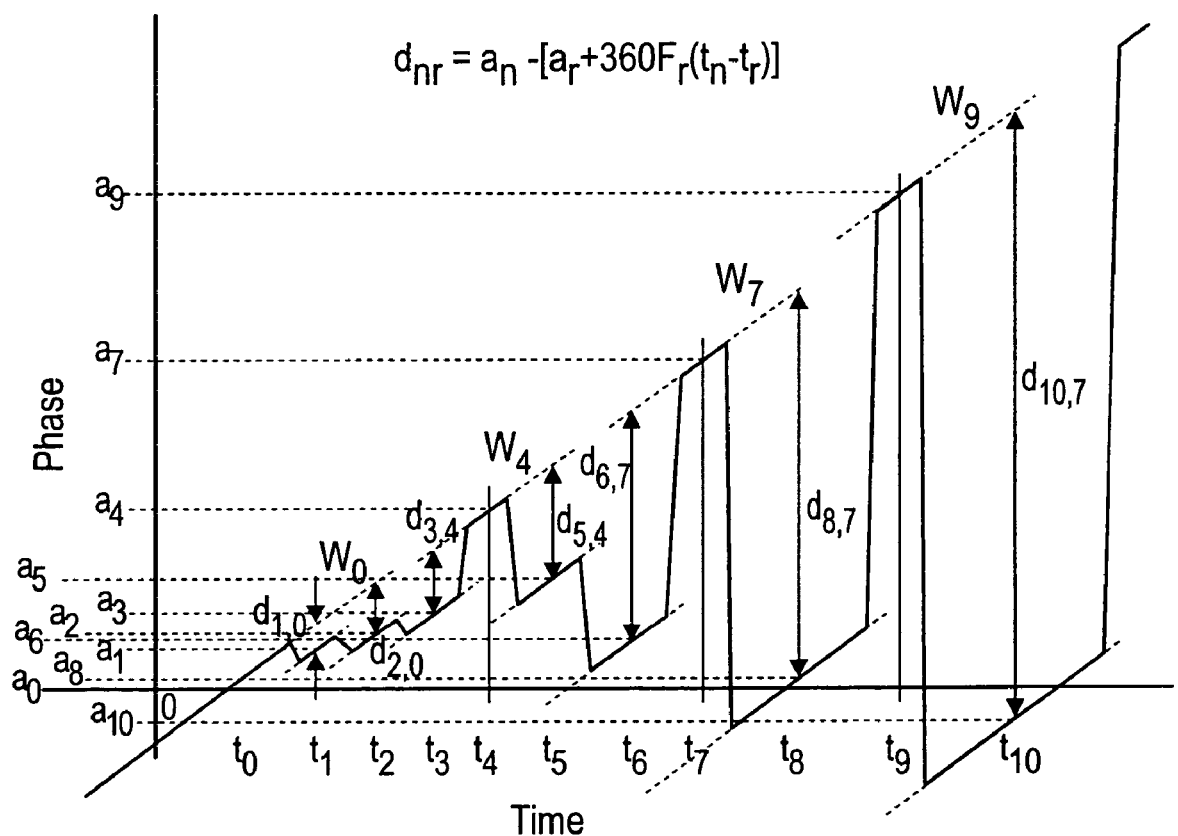
FIG. 4 is a graph of phase vs. time.

Phase measurement performed by the current invention is shown through the use of FIG. 4 showing phase vs. time. Phase measurements are made at the same time as amplitude measurements. In a standard two port network analyzer, such as that shown in FIG. 1, a reference signal is available. In the present invention, such a reference is not present.

In one embodiment of the invention, coherent demodulation is used to process the signal from device 300. As source 320 in device 300 is not locked to source 420 in measurement unit 400, it is necessary to compensate for the offset between the expected frequency of device 300 and the actual frequency measured by measurement unit 400. A continuous-wave signal f(t) can be represented mathematically as:

$$f(t) = \alpha \cos(\omega t + \phi)$$

where $\alpha$ is the amplitude of the signal, $\omega$ is the signal frequency, and $\phi$ is the phase shift. By making quadrature measurements of output signal 350 during a measurement interval, estimates of amplitude, frequency, and phase may be derived by matching output signal 350 to a reference, for example, by computing a least-squares fit for parameters $\alpha$ (amplitude), $\omega$ (frequency), and $\phi$ (phase).

When the frequency is estimated, the demodulated signal may be compensated for a frequency offset from a reference, and the resulting amplitude and phase trajectory may be processed to extract both amplitude and phase information. As previously described, amplitude information is extracted by estimating the magnitude over each step in the test sequence and matching these estimates with the bias levels used during the corresponding measurement interval. Phase information is extracted by processing the phase trajectory of the frequency offset corrected demodulated signal.

If the frequency offset correction were perfect, indicating that source 320 in device 300 is stable, the phase trajectory shown in FIG. 4 at reference level to should be flat. The phase trajectory during measurement intervals corresponding to other bias levels for amplifier 310, at times $t_1$, $t_2$, $t_3$, $t_5$, $t_6$, $t_8$, and $t_{10}$, should also be flat but offset by the change in phase shift as a result of the change in bias level of amplifier 310 away from the reference bias level.

FIG. 4 shows a more common condition in which the correction may not be perfect, and the stability of source 320 may not be great. While exaggerated in FIG. 4, drift or errors in the frequency estimate may result in errors in the estimate of the phase shift for a particular bias level. As with amplitude measurements, these errors may be reduced by periodically returning to a reference bias level, as shown in FIG. 4 for times $t_0$, $t_4$, $t_7$, and $t_9$, and redetermining frequency and phase information. Particularly for long test sequences, using phase/frequency information from nearby reference intervals minimizes errors due to instability in source 320, as its phase and frequency will generally drift with time.

As shown in FIG. 4, an estimation of the phase shift for a particular bias level is obtained by measuring the phase and phase trajectory at a reference level, measuring the phase at the desired bias level, and computing the difference between the estimated phase trajectory and the measured phase. Measuring phase information at point $t_0$ gives phase value $a_0$. Measuring the phase trajectory in the interval containing point $t_0$ on the graph gives a line through $a_0$ with a given slope. When the amplifier bias is shifted for the measurement including point $t_1$, giving phase value $a_1$ on the graph, a similar trajectory is produced, but shifted. The estimated phase shift at point $t_1$ is found by estimating the reference phase trajectory at time $t_1$ from the value at time $t_0$, and subtracting the phase value at $t_1$, which is $a_1$. This difference is shown as $d_{1,0}$ on the graph. Similarly, the phase shift at point $t_2$ is estimated by computing the difference from the reference phase trajectory and the measured phase $a_2$, producing value $d_{2,0}$.

An alternative to extrapolating the phase trajectory forward from time $t_0$ to time $t_1$ would be to use reference measurement $a_4$ at time $t_4$ and interpolate between points ($t_0$, $a_0$) and ($t_4$, $a_4$) at time $t_1$, and subtract the measured phase $a_1$ to estimate the phase shift. Interpolation between measured reference points may be more desirable than extrapolating forward, as the necessity for computing and estimating phase trajectories is replaced by the interpolation process. Many interpolation methods may be used, ranging from simple linear interpolation to more complex approaches including splines and/or higher-order methods involving more than one reference point. As an example, reference data from four measurements, ($t_0$, $a_0$), ($t_4$, $a_4$), ($t_7$, $a_7$) and ($t_9$, $a_9$) could be used to fit a curve such as a cubic spline or a least-squares line, and interpolation performed to provide estimates of the reference phase at times $t_1$, $t_2$, $t_5$, $t_6$, $t_8$, and $t_{10}$. The multiple-point approach may also be used in extrapolation. As an example, reference data ($t_0$, $a_0$) and ($t_4$, $a_4$) may be used to extrapolate the phase trajectory for $t_5$ and $t_6$.

The accuracy and flexibility of measurements made according to the present invention may be improved in some situations. Already discussed, it may be advantageous to use different measurement intervals for different bias levels. The accuracy of measurements may generally be improved by the use of longer intervals. Since the measurements are made with respect to pulses at the reference bias point, having high accuracy on these reference measurements is paramount. Using longer intervals also enhances the ability to estimate the frequency. At bias levels corresponding to low output levels, the noise of the measurement system may degrade achievable accuracy. Using longer intervals allows the effective bandwidth of the measurements to be reduced so as to ameliorate the effects of noise on measurement accuracy. Conversely, for measurements made at high signal levels, shorter pulses may be used to reduce test time. The duration of each interval may be chosen to achieve a particular level of measurement accuracy. Overall, measurement intervals may be chosen to minimize overall test time while achieving the required level of measurement accuracy.

Another area for flexibility and possible improvement is through selecting which portion of the interval or pulse is to be employed for the measurement. The measurement interval should be selected to reduce the effects of transients and settling errors associated with switching bias levels. In the examples given and shown in FIGS. 3 and 4, the center of the interval is used. Alternatives to using the center of the interval include specifying start and stop times during the interval, or the temporal center of the measurement interval and the measurement width.

Placement and number of reference intervals may also be varied. Multiple test levels may be placed between reference level measurements; reducing the number of reference level measurements will reduce overall test time. Increasing the number of reference level measurements may result in increased measurement accuracy, particularly with respect to devices which drift appreciably during measurements.

The foregoing detailed description of the present invention is provided for the purpose of illustration and is not intended to be exhaustive or to limit the invention to the precise embodiments disclosed. Accordingly the scope of the present invention is defined by the appended claims.

What is claimed is:

1. A method of measuring amplitude and phase characteristics of an output signal of an RF amplifier in a device, the RF amplifier amplifying a signal source within the device producing a signal of a known frequency, the gain of the RF amplifier controlled within the device producing to produce a series of predetermined bias steps over predetermined bias step intervals, the method comprising:
   receiving the output signal of the RF amplifier in a measurement unit,
   the measurement unit designating at least one of the bias steps as a reference level and a reference interval,
   the measurement unit measuring amplitude of the output signal and phase information for the output signal over each of the bias step intervals,
   the measurement unit calculating the phase trajectory of the output signal over the reference interval, and
   computing the phase shift of the output signal at a bias step interval by subtracting the phase information for the output signal at the bias step interval from the calculated phase trajectory for that bias step interval.

2. The method of claim 1 where the measuring steps measure the output signal over a selected portion of the bias step interval.

3. The method of claim 1 where the measuring steps measure the output signal over a center of the bias step interval.

4. The method of claim 1 where the bias step intervals are uniform.

5. The method of claim 1 where the predetermined bias step intervals include a first bias step interval used as the reference interval.

6. The method of claim 1 where the reference level repeats during the predetermined bias step intervals.

7. The method of claim 1 where at least one bias step interval representing a low power level of the output signal is longer in duration than at least one bias step interval representing a high power level of the output signal.

8. The method of claim 1 where the reference interval has a longer duration than the other bias step intervals.

9. The method of claim 1 where the bias step intervals are selected to achieve a predetermined measurement accuracy.

10. The method of claim 1 where the bias step intervals are selected to minimize overall test time while achieving a predetermined measurement accuracy.

11. The method of claim 1 where the calculated phase trajectory is calculated by extrapolating from a single reference interval.

12. The method of claim 1 where the calculated phase trajectory is calculated by extrapolating from more than one reference interval.

13. The method of claim 1 where the calculated phase trajectory is calculated by interpolating between two reference intervals.

14. The method of claim 1 where the calculated phase trajectory is calculated by interpolating among more than two reference intervals.

15. The method of claim 2, where the selected portion of the bias step interval is free from bias step transients.

* * * * *